United States Patent
Chen et al.

(10) Patent No.: US 7,608,515 B2
(45) Date of Patent: Oct. 27, 2009

(54) DIFFUSION LAYER FOR STRESSED SEMICONDUCTOR DEVICES

(75) Inventors: Hao-Yu Chen, Kaohsiung (TW); Shui-Ming Cheng, Chu-bai (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 411 days.

(21) Appl. No.: 11/353,309

(22) Filed: Feb. 14, 2006

(65) Prior Publication Data

US 2007/0190731 A1    Aug. 16, 2007

(51) Int. Cl.
H01L 21/4763    (2006.01)

(52) U.S. Cl. .................. 438/297; 438/300; 438/429; 438/430; 438/589; 438/607; 257/E21.133; 257/E21.409; 257/E21.431; 257/E21.633; 257/E21.644; 257/E29.04; 257/E29.063; 257/E29.084; 257/E29.121; 257/E29.267

(58) Field of Classification Search ......... 438/142–309, 438/627, 643, 653, 297, 300, 429, 430, 589, 438/607; 257/751, E23.16, E21.584, E21.148, 257/151, 199, 335, 345, 409, 431, 438, 444, 257/E29.021, 63, 121, 155, E21.133, 429, 257/437, 633, 634, 641, 652, E29.04, 84, 257/267

See application file for complete search history.

(56) References Cited

U.S. PATENT DOCUMENTS

| | | | |
|---|---|---|---|
| 5,132,768 A * | 7/1992 | Jaecklin et al. | 257/152 |
| 5,312,768 A * | 5/1994 | Gonzalez | 438/227 |
| 5,908,313 A * | 6/1999 | Chau et al. | 438/299 |
| 6,492,216 B1 * | 12/2002 | Yeo et al. | 438/197 |
| 6,635,543 B2 | 10/2003 | Furukawa et al. | |
| 6,653,856 B1 | 11/2003 | Liu | |
| 6,762,463 B2 | 7/2004 | Kim | |
| 6,762,961 B2 | 7/2004 | Eleyan et al. | |
| 6,815,970 B2 | 11/2004 | Rost et al. | |
| 6,846,720 B2 | 1/2005 | Balasubramanian et al. | |
| 6,887,762 B1 * | 5/2005 | Murthy et al. | 438/300 |
| 6,905,918 B2 | 6/2005 | Mouli | |
| 6,921,913 B2 * | 7/2005 | Yeo et al. | 257/18 |

(Continued)

OTHER PUBLICATIONS

Chen, G., et al., "Dynamic NBTI of p-MOS Transistors and Its Impact on MOSFET Scaling," IEEE Electron Device Letters (2002) pp. 1-3.

(Continued)

*Primary Examiner*—Michael S Lebentritt
(74) *Attorney, Agent, or Firm*—Slater & Matsil, L.L.P.

(57) ABSTRACT

A diffusion layer for semiconductor devices is provided. In accordance with embodiments of the present invention, a semiconductor device, such as a transistor, comprises doped regions surrounded by a diffusion barrier. The diffusion barrier may be formed by recessing regions of the substrate and implanting fluorine or carbon ions. A silicon layer may be epitaxially grown over the diffusion barrier in the recessed regions. Thereafter, the recessed regions may be filled and doped with a semiconductor or semiconductor alloy material. In an embodiment, a semiconductor alloy material, such as silicon carbon, is selected to induce a tensile stress in the channel region for an NMOS device, and a semiconductor alloy material, such as silicon germanium, is selected to induce a compressive stress in the channel region for a PMOS device.

20 Claims, 3 Drawing Sheets

U.S. PATENT DOCUMENTS

| | | | |
|---|---|---|---|
| 7,105,897 B2 | 9/2006 | Chen et al. | |
| 7,112,495 B2* | 9/2006 | Ko et al. | 438/300 |
| 7,129,548 B2* | 10/2006 | Chan et al. | 257/382 |
| 7,132,338 B2* | 11/2006 | Samoilov et al. | 438/300 |
| 7,358,551 B2* | 4/2008 | Chidambarrao et al. | 257/288 |
| 7,413,961 B2* | 8/2008 | Chong et al. | 438/430 |
| 7,436,026 B2* | 10/2008 | Kreps | 257/344 |
| 7,436,035 B2* | 10/2008 | Murthy et al. | 257/408 |
| 2004/0166611 A1* | 8/2004 | Liu | 438/142 |
| 2005/0045951 A1 | 3/2005 | Yamada et al. | |
| 2007/0072353 A1* | 3/2007 | Wu et al. | 438/197 |

OTHER PUBLICATIONS

El Mubarek, H. A. W., et al., "Effect of Fluorine Implantation Dose on Boron Transient Enhanced Diffusion and Boron Thermal Diffusion in $Si_{1-x}Ge_x$," IEEE Transactions on Electron Devices, vol. 52, No. 4 (Apr. 2005) pp. 518-526.

Fenouillet-Beranger, C., et al., "Requirements for ultra-thin-film devices and new materials on CMOS Roadmap," IEEE, 2003, pp. 145-146.

Fukada, Y., et al., "Special Edition on $21^{st}$ Century Solutions: SOI-CMOS Device Technology," OKI Technical Review 185, vol. 68, Mar. 2001, pp. 54-57.

Koh, R., "Buried Layer Engineering to Reduce the Drain-Induced Barrier Lowering of Sub-0.05 μm SOI-MOSFET," Jpn. J. Appl. Phys., vol. 38, 1999, pp. 2294-2299.

Roche, P., et al., "Comparisons of Soft Error Rate for SRAMs in Commercial SOI and Bulk Below the 130-nm Technology Node," IEEE Transactions on Nuclear Science, vol. 50, No. 6, Dec. 2003, pp. 2046-2054.

Mandelman, J.A., et al., "Floating-Body Concerns for SOI Dynamic Random Access Memory (DRAM)," Proceedings of the IEEE International SOI Conference, Oct. 1996, pp. 136-137.

Yang, M., et al., "High Performance CMOS Fabricated on Hybrid Substrate With Different Crystal Orientations," IEDM, 2003, pp. 453-456.

Rim, K., et al., "Fabrication and Mobility Characteristics of Ultra-thin Strained Si Directly on Insulator (SSDOI) MOSFETs," IEDM, 2003, pp. 49-52.

\* cited by examiner

DIFFUSION LAYER FOR STRESSED SEMICONDUCTOR DEVICES

TECHNICAL FIELD

The present invention relates generally to semiconductor devices, and more particularly, to metal-oxide-semiconductor field-effect transistors and methods of manufacture.

BACKGROUND

Size reduction of metal-oxide-semiconductor field-effect transistors (MOSFETs), including reduction of the gate length and gate oxide thickness, has enabled the continued improvement in speed, performance, density, and cost per unit function of integrated circuits over the past few decades. To further enhance transistor performance, MOSFET devices have been fabricated using strained channel regions located in portions of a semiconductor substrate. Strained channel regions allow enhanced carrier mobility to be realized, thereby resulting in increased performance when used for n-channel (NMOS) or for p-channel (PMOS) devices. Generally, it is desirable to induce a tensile strain in an NMOS transistor in the source-to-drain direction to increase electron mobility and to induce a compressive strain in a PMOS transistor in the source-to-drain direction to increase hole mobility. There are several existing approaches of introducing strain in the transistor channel region.

In one approach, semiconductor alloy layers, such as silicon-germanium or silicon-germanium-carbon, are formed in the source/drain regions, wherein the semiconductor alloy layers have a different lattice structure than the substrate. The different lattice structures impart strain in the channel region to increase carrier mobility.

The semiconductor alloy layers are typically in-situ doped epitaxial layers, providing a low resistance and inducing strain in the channel regions. The dopant, however, has a tendency to out diffuse into the channel region during the epitaxial thermal process, thereby degrading the device's short-channel characteristics. Furthermore, particularly with PMOS devices, hydrogen is used to improve the epitaxy quality. The hydrogen, however, degrades negative bias temperature instability (NBTI).

Therefore, there is a need for a semiconductor device, and a method of manufacture thereof, having a semiconductor alloy in the source/drain regions that reduces or prevents dopant diffusion into the channel region.

SUMMARY OF THE INVENTION

These and other problems are generally reduced, solved or circumvented, and technical advantages are generally achieved, by embodiments of the present invention, which provides a deuterated layer between a gate oxide and a gate electrode.

In an embodiment of the present invention, a diffusion barrier between two regions of a substrate is provided. For example, in an embodiment, a diffusion barrier is provided between the source/drain regions and the substrate, which may be lightly doped or undoped. In this embodiment, the diffusion barrier may be formed by recessing regions of the substrate and implanting fluorine or carbon ions. Other materials and processes may be used to form the diffusion barrier. An optional semiconductor layer (e.g., silicon) may be epitaxially grown over the diffusion barrier in the recessed regions. Thereafter, the recessed regions may be filled and doped with a semiconductor or semiconductor alloy material.

In an embodiment, a semiconductor alloy material, such as silicon carbon, is selected to induce a tensile stress in the channel region for an NMOS device, and a semiconductor alloy material, such as silicon germanium, is selected to induce a compressive stress in the channel region for a PMOS device.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 1-6 illustrate a method embodiment for fabricating a semiconductor device having a diffusion layer in accordance with an embodiment of the present invention. Embodiments of the present invention illustrated herein may be used in a variety of circuits. In particular, embodiments of the present invention are particularly useful for sub-65 nm transistor designs in which dopant penetration into the substrate may be particularly troublesome. This diffusion layer can improve the device reliability.

Figure 1:
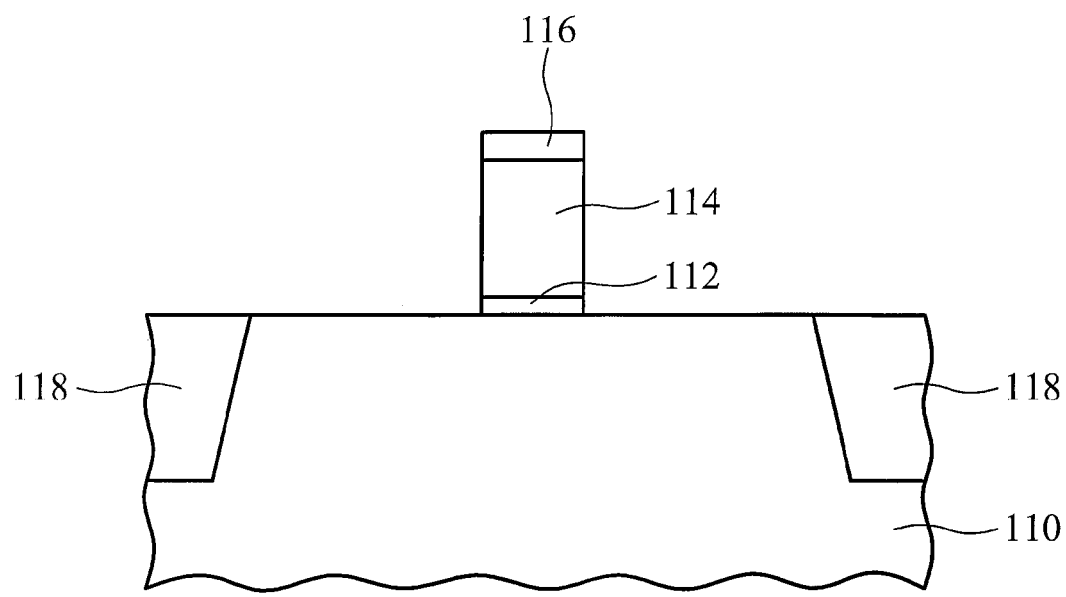
FIGS. 1-6 illustrate various process steps of fabricating a MOSFET device having a diffusion layer in accordance with an embodiment of the present invention.

Referring first to FIG. 1, a substrate 110 is shown having a gate dielectric 112 and a gate electrode 114 formed thereon in accordance with an embodiment of the present invention. In an embodiment, the substrate 110 comprises a P-type bulk silicon substrate. Other materials, such as germanium, silicon-germanium alloy, or the like, could alternatively be used for the substrate 110. The substrate 110 may also be an active layer of a semiconductor-on-insulator (SOI) substrate or a multi-layered structure such as a silicon-germanium layer formed on a bulk silicon layer. Generally, an SOI comprises a layer of a semiconductor material, such as silicon, formed on an insulator layer. The insulator layer may be, for example, a buried oxide (BOX) layer or a silicon oxide layer. The insulator layer is generally provided on a substrate, typically a silicon or glass substrate. Other substrates, such as a multi-layered or gradient substrate, may also be used. The substrate may have P-wells (not shown) and/or N-wells (not shown) formed therein to provide further isolation for NMOS devices and PMOS devices, respectively.

The gate dielectric 112 and the gate electrode 114 may be formed by depositing and patterning a dielectric layer and a conductive layer over the substrate 110. The dielectric layer preferably comprises a dielectric material, such as silicon dioxide, silicon oxynitride, silicon nitride, a nitrogen-containing oxide, a high-K metal oxide, a combination thereof, or the like. A silicon dioxide dielectric layer may be formed, for example, by an oxidation process, such as wet or dry thermal oxidation, or by CVD oxide, such as LPCVD (Low Pressure Chemical Vapor Deposition) oxide, PECVD (Plasma Enhanced Chemical Vapor Deposition) oxide or ALCVD (Atomic Layer Chemical Vapor Deposition) oxide.

The conductive layer comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and re-crystallized to create poly-crystalline silicon (poly-silicon). In the preferred embodiment in which the gate electrode 114 is poly-silicon, the gate electrode 114 may be formed by depositing doped or undoped poly-silicon by low-pressure chemical vapor deposition (LPCVD). The poly-silicon may be doped with an N-type dopant or a P-type dopant to form an NMOS device or a PMOS device, respectively.

The gate dielectric 112 and the gate electrode 114 may be patterned by photolithography techniques as are known in the art. Generally, photolithography involves depositing a photoresist material, which is then masked, exposed, and developed. After the photoresist mask is patterned, an anisotropic etching process may be performed to remove unwanted portions of the dielectric layer and the conductive layer to form the gate dielectric 112 and the gate electrode 114, respectively, as illustrated in FIG. 1.

An optional mask layer 116 may be formed on the gate electrode 114 to protect the underlying gate electrode from being removed during an etching process. One such suitable mask layer 116 comprises an oxide layer and a nitride layer. In an embodiment, the oxide layer comprises silicon oxynitride (SiON) and the nitride layer comprises silicon nitride (SiN). Other materials may be used.

Shallow-trench isolations (STIs) 118, or some other isolation structures such as field oxide regions, may be formed in the substrate 110 to isolate active areas on the substrate. The STIs 118 may be formed by etching trenches in the substrate 110 and filling the trenches with a dielectric material, such as silicon dioxide, a high-density plasma (HDP) oxide, or the like, as known in the art.

Figure 2:
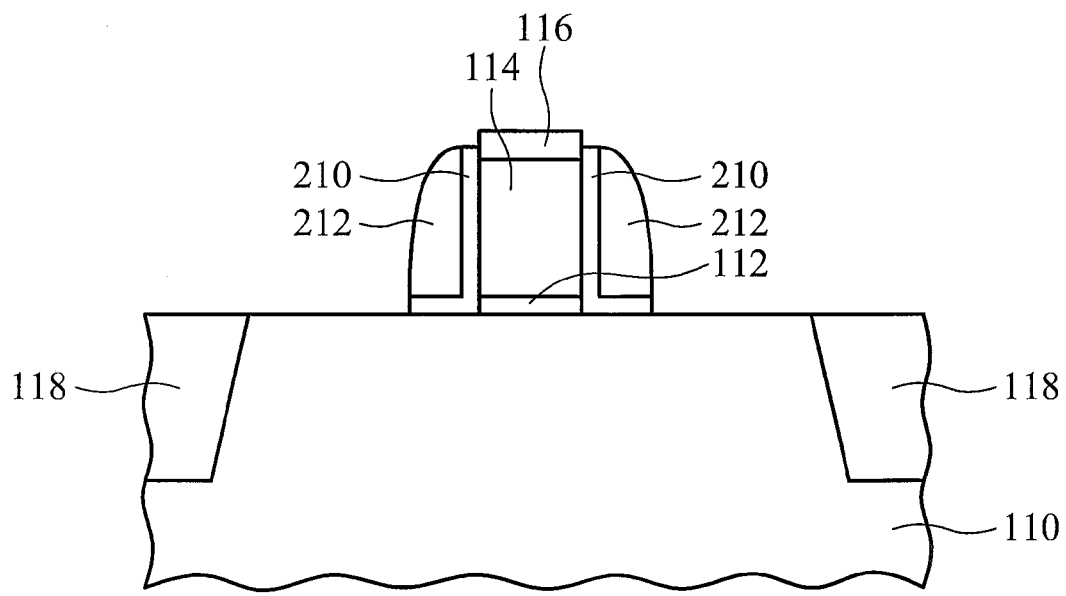

FIG. 2 illustrates the substrate 110 after sacrificial liners 210 and sacrificial spacers 212 have been formed adjacent the sidewalls of the gate electrode 114. The sacrificial liner 210 is preferably an oxide layer formed, for example, by chemical vapor deposition (CVD) techniques using tetra-ethyl-orthosilicate (TEOS) and oxygen as a precursor. The sacrificial spacer 212 preferably comprises $Si_3N_4$, or another nitrogen-containing layer, such as $Si_xN_y$, silicon oxynitride $SiO_xN_y$, silicon oxime $SiO_xN_y$:$H_z$, or a combination thereof. In a preferred embodiment, the sacrificial spacer 212 is formed from a layer comprising $Si_3N_4$ that has been formed using CVD techniques using silane and ammonia as precursor gases, and deposition temperatures ranging from about 400° to about 600° C. In an embodiment, a combined thickness of a sacrificial liner 210 and sacrificial spacer 212 is greater than about 30 Å.

It should be noted that different materials may be used to form the sacrificial liners 210 and sacrificial spacers 212. However, the materials used to form the sacrificial liners 210 and sacrificial spacers 212 should be selected such that there is a high-etch selectivity between the material used to form the sacrificial liners 210 and the material used to form the sacrificial spacers 212.

Figure 3:
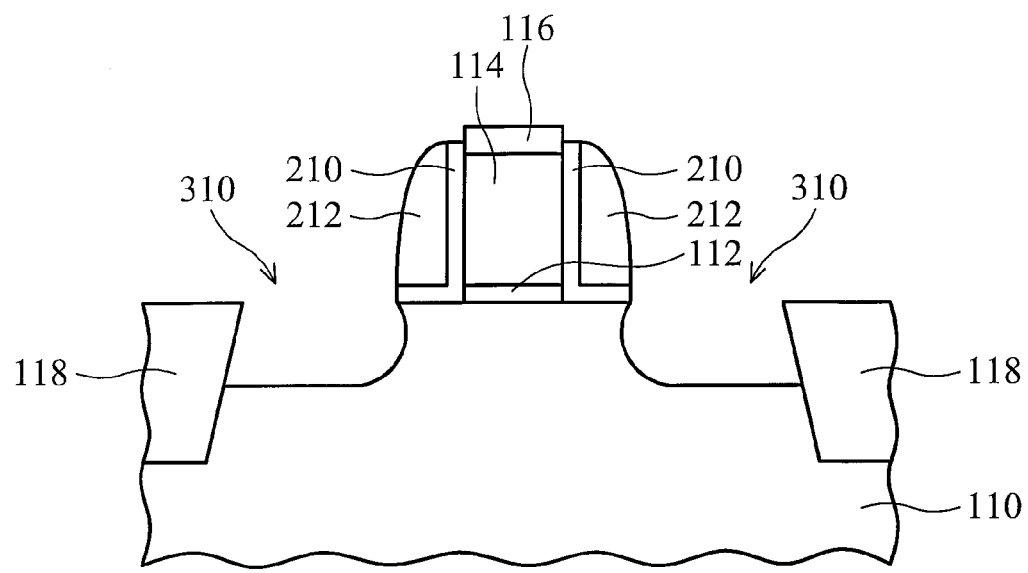

FIG. 3 illustrates the substrate 110 after recesses 310 have been formed in accordance with an embodiment of the present invention. The recesses 310 may be formed by an anisotropic or isotropic etch process, but are preferably formed by an isotropic etch process, preferably a dry etch process. In an embodiment, the recess is greater than about 50 nm in depth. As illustrated in FIG. 3, the recess 310 preferably extends laterally beneath a portion of the sacrificial spacers 212 for a distance greater than about 10 nm.

Figure 4:
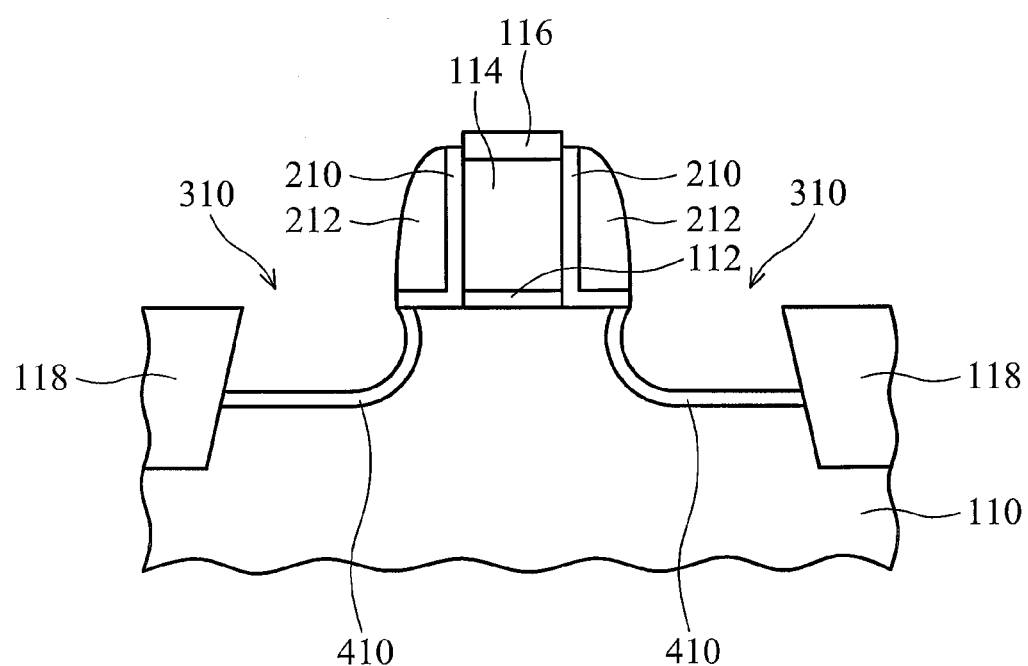

FIG. 4 illustrates the substrate 110 of FIG. 3 after a barrier layer 410 has been formed along the surface of the recess 310 in accordance with an embodiment. In an embodiment, the barrier layer 410 is formed by implanting, for example, fluorine ions. It has been found that by implanting fluorine ions into the surface of the recess 310 the penetration of hydrogen atoms during the formation of a stress-induced layer (discussed below with reference to FIG. 6) may be prevented or reduced, thereby improving the NBTI characteristics of the transistor. Furthermore, the fluorine ions also help suppress dopant out diffusion from the source/drain regions, thereby reducing the drain induced barrier lowering (DIBL) degradation of short-channel regions. In an embodiment, the implanting process comprises implanting fluorine ions at a dose of about 1E13 to about 1E15 atoms/cm$^3$ and at an energy of about 0.3 to about 2 KeV. Other ions, such as carbon, nitrogen, combinations thereof, or the like, may be used, and other processes, such as plasma ion implantation (PII), gas annealing, low-energy implantation, or the like, may also be used. The barrier layer 410 is preferably about 1 nm to about 10 nm in thickness.

Figure 5:
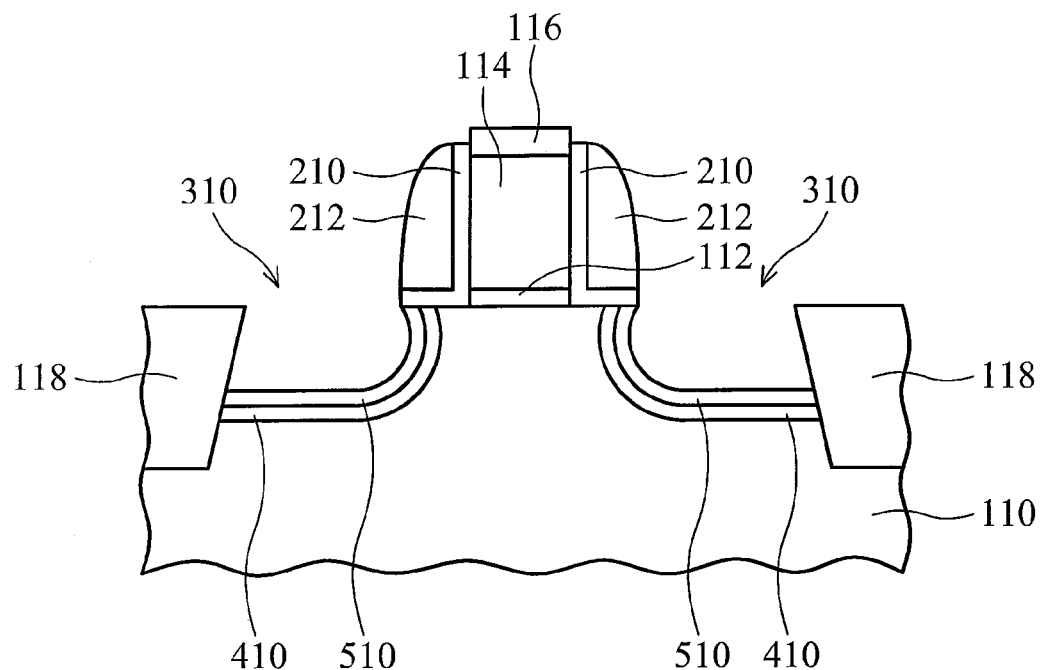

FIG. 5 illustrates the substrate 110 of FIG. 4 after an optional first semiconductor layer 510 has been formed along the surface of the recess 310 in accordance with an embodiment of the present invention. In an embodiment, the first semiconductor layer 510 is formed of semiconductor material similar to the substrate 110, e.g., silicon. As discussed in greater detail below, it is preferred that the recess 310 be filled in with a strain inducing layer, and it has been found that a silicon layer over the barrier layer 410 helps avoid strain relaxation when the strain-induced layer is formed in subsequent steps by preventing or reducing the diffusion of the barrier layer 410 into the strain-induced layer.

Accordingly, in the case in which the substrate 110 is formed of silicon, the first semiconductor layer 510 may be a selective epitaxial layer grown using the substrate 110 as a seed layer as is known in the art. The first semiconductor layer 510 is preferably about 1 nm to about 10 nm in thickness.

Optionally, an anneal (e.g., a rapid thermal anneal (RTA) or a furnace thermal anneal) may be performed prior to forming the first semiconductor layer 510. In an embodiment, it has been found that, for example, an RTA performed at a temperature of about 700° C. to about 1020° C. for about 0 seconds to about 1 minute repairs the surface of the substrate 110 in the recess 310, thereby creating a smoother surface from which the first semiconductor layer 510 may be grown. By starting with a smoother surface, the first semiconductor layer 510 may be more uniform and with fewer defects.

Figure 6:
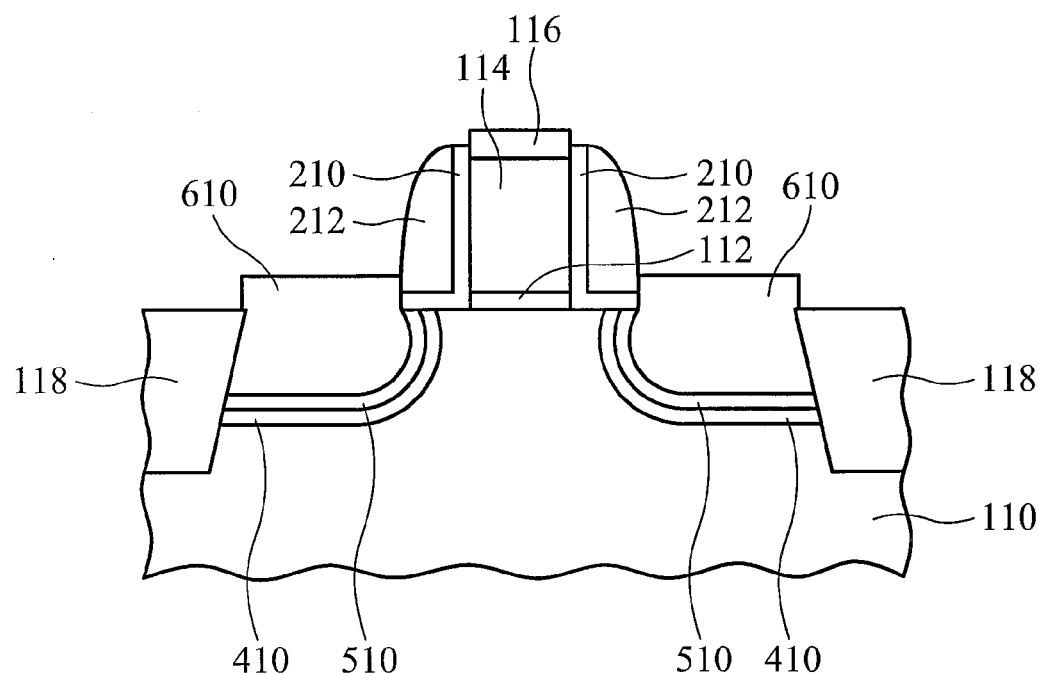

FIG. 6 illustrates the substrate 110 of FIG. 5 after a second semiconductor layer 610 is formed in the source/drain regions in accordance with an embodiment of the present invention. Preferably, the second semiconductor layer 610 is a strain-induced layer exerting strain in the channel region of the transistor to further enhance transistor performance. As is known in the art, strained channel regions allow enhanced carrier mobility to be realized, thereby resulting in increased performance when used for NMOS and PMOS devices. Generally, it is desirable to induce a tensile strain in the source-to-drain direction of the channel region of an NMOS device to increase electron mobility and to induce a compressive strain in the source-to-drain direction of the channel region of a PMOS device to increase hole mobility.

Accordingly, for a PMOS device, the second semiconductor layer 610 may be a silicon germanium alloy layer. Preferably, the silicon germanium alloy layer is epitaxially grown as a substantially monocrystalline layer by, for example, ultra-high vacuum chemical vapor deposition (UHVCVD) or molecular beam epitaxy (MBE). For an NMOS device, the second semiconductor layer 610 may be silicon carbon or silicon-germanium-carbon epitaxially grown. Other materials may be used.

The second semiconductor layer 610 preferably has a thickness from about 400 Å to about 900 Å and may be raised above a surface of the substrate 110, i.e., the source and drain may be raised.

Thereafter, standard processing techniques may be used to complete fabrication of a PMOS or NMOS transistor. For example, the sacrificial liners 210 and spacers 212 may be removed, source/drain regions may be formed by implanting N-type or P-type ions, contact regions may be silicided, and the like.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a gate electrode on a substrate;
    forming sacrificial spacers along opposing sidewalls of the gate electrode;
    forming recesses in the substrate on opposing sides of the gate electrode, the recesses extending under the sacrificial spacers;
    forming a diffusion barrier in the recesses of the substrate; and
    forming source/drain regions in the recesses.

2. The method of claim 1, further comprising forming spacers adjacent the gate electrode prior to the forming recesses.

3. The method of claim 2, wherein the spacers have a width greater than about 30 nm.

4. The method of claim 1, wherein the recesses have a depth greater than about 50 nm.

5. The method of claim 1, wherein the recesses have a width greater than about 10 nm.

6. The method of claim 1, wherein the forming the diffusion barrier includes forming a fluorine-rich silicon layer, a carbon-rich silicon layer, a nitrogen-rich silicon layer, or a combination thereof in the substrate in the recesses.

7. The method of claim 6, wherein the fluorine-rich silicon layer has a thickness from about 1 nm to about 10 nm.

8. The method of claim 1, wherein the forming the source/drain regions comprises epitaxially growing a silicon layer in the recesses and depositing a semiconductor alloy on the silicon layer.

9. A method of forming a semiconductor device, the method comprising:
    forming a gate electrode on a substrate;
    recessing source/drain regions of the gate electrode;
    forming a barrier layer in the substrate in the source/drain regions;
    forming a first semiconductor layer in the source/drain regions;
    forming a semiconductor alloy layer on the first semiconductor layer; and
    annealing after the forming the first semiconductor layer and before the forming the semiconductor alloy layer.

10. The method of claim 9, further comprising forming spacers adjacent the gate electrode prior to the recessing the source/drain regions.

11. The method of claim 10, wherein the spacers have a width greater than about 30 nm.

12. The method of claim 9, wherein the recessing comprises recessing the substrate in the source/drain regions for a depth greater than about 50 nm.

13. The method of claim 9, wherein the recessing comprises recessing the substrate in the source/drain regions a width greater than about 10 nm.

14. The method of claim 9, wherein the forming the barrier layer includes implanting fluorine ions, carbon ions, nitrogen ions, or a combination thereof in the substrate in the recesses.

15. The method of claim 9, wherein the barrier layer has a thickness from about 1 nm to about 10 nm.

16. The method of claim 9, wherein the forming the first semiconductor layer comprises epitaxially growing a silicon layer.

17. A method of forming a semiconductor device, the method comprising:
    providing a substrate;
    forming a gate electrode on the substrate;
    forming dummy spacers along opposing sides of the gate electrode;
    recessing the substrate adjacent the dummy spacers, thereby forming recessed regions;
    forming a barrier layer in the recessed regions of the substrate;
    forming a first semiconductor layer in the recessed regions;
    forming a second semiconductor layer on the first semiconductor layer, the second semiconductor layer having a different lattice structure than the first semiconductor layer; and
    removing the dummy spacers after the forming the second semiconductor layer.

18. The method of claim 17, wherein the forming the barrier layer comprises implanting fluorine ions, carbon ions, nitrogen ions, or a combination thereof in the recessed regions of the substrate.

19. The method of claim 17, wherein the forming the first semiconductor layer comprises epitaxially growing a silicon layer.

20. The method of claim 17, wherein the forming the second semiconductor layer comprises depositing silicon-germanium, silicon carbon, or silicon-carbon germanium.

* * * * *